(12) United States Patent
Zhang

(10) Patent No.: US 9,936,306 B1
(45) Date of Patent: Apr. 3, 2018

(54) MEMS MICROPHONE

(71) Applicant: AAC Technologies Pte, Ltd., Singapore (SG)

(72) Inventor: Jinyu Zhang, Shenzhen (CN)

(73) Assignee: AAC TECHNOLOGIES PTE. LTD., Singapore (SG)

( * ) Notice: Subject to any disclaimer, the term of this patent is extended or adjusted under 35 U.S.C. 154(b) by 0 days.

(21) Appl. No.: 15/645,834

(22) Filed: Jul. 10, 2017

(30) Foreign Application Priority Data

Mar. 6, 2017 (CN) .......................... 2017 1 0127164

(51) Int. Cl.
| | |
|---|---|
| *H04R 3/00* | (2006.01) |
| *H04R 19/04* | (2006.01) |
| *H04R 1/04* | (2006.01) |
| *H04R 19/00* | (2006.01) |
| *H04R 7/18* | (2006.01) |
| *H04R 7/04* | (2006.01) |
| *B81B 7/00* | (2006.01) |

(52) U.S. Cl.
CPC ........... *H04R 19/04* (2013.01); *B81B 7/0061* (2013.01); *H04R 1/04* (2013.01); *H04R 7/04* (2013.01); *H04R 7/18* (2013.01); *H04R 19/005* (2013.01); *B81B 2201/0257* (2013.01); *B81B 2203/019* (2013.01); *B81B 2203/0127* (2013.01); *B81B 2203/0315* (2013.01); *B81B 2203/0353* (2013.01); *B81B 2207/012* (2013.01); *H04R 2201/003* (2013.01)

(58) Field of Classification Search
CPC . H04R 19/04; H04R 1/04; H04R 7/04; H04R 7/18; H04R 19/005; H04R 2201/003; B81B 7/0061; B81B 2201/0257; B81B 2203/0127; B81B 2203/019; B81B 2203/0315; B81B 2203/0353; B81B 2207/012
See application file for complete search history.

(56) References Cited

U.S. PATENT DOCUMENTS

| | | | | |
|---|---|---|---|---|
| 8,779,535 | B2 * | 7/2014 | Goida ................... | B81B 7/0061 257/416 |
| 2014/0225203 | A1 * | 8/2014 | Yang ..................... | B81B 7/0061 257/416 |
| 2015/0003659 | A1 * | 1/2015 | Theuss ................. | H04R 19/005 381/355 |

* cited by examiner

*Primary Examiner* — Andrew L Sniezek
(74) *Attorney, Agent, or Firm* — Na Xu; IPro, PLLC

(57) ABSTRACT

The invention discloses a MEMS microphone, which includes a case with an accommodating cavity and an acoustic vent arranged on the case, a housing with an empty cavity as well as MEMS and ASIC chips with a back cavity are arranged inside the accommodating cavity. The housing is installed on the case, the MEMS chips are installed in the housing, the housing is arranged with a through hole connecting the empty cavity and the back cavity. The housing is also arranged with a vent hole. The MEMS microphone also includes a membrane flap arranged on the housing and used to close the vent hole. The membrane flap changes its shape under airflow effects and opens the vent hole. The MEMS microphone of this invention can avoid the diaphragm of the MEMS chips being damaged by airflow impact.

9 Claims, 5 Drawing Sheets

MEMS MICROPHONE

FIELD OF THE PRESENT DISCLOSURE

The present disclosure relates to the field of microphones, especially to a MEMS microphone.

DESCRIPTION OF RELATED ART

The MEMS microphone of the related technology comprises a case with an accommodating cavity, an acoustic hole arranged on the case and MEMS chips and ASIC chips accommodated in the accommodating cavity.

The diaphragm of the MEMS chip is often damaged by airflow impact caused by gas blowing, drop or temperature change, the usual solution is to open a groove or a hole in the diaphragm which penetrates the diaphragm to balance the gas pressure on both sides of the diaphragm. However, opening a groove or a hole in the diaphragm will reduce the strength of the diaphragm itself.

Therefore it is necessary to provide an improved MEMS microphone for overcoming the above-mentioned disadvantages.

BRIEF DESCRIPTION OF THE DRAWING

Many aspects of the exemplary embodiments can be better understood with reference to the following drawing. The components in the drawing are not necessarily drawn to scale, the emphasis instead being placed upon clearly illustrating the principles of the present disclosure.

DETAILED DESCRIPTION OF THE EXEMPLARY EMBODIMENTS

Figure 1:
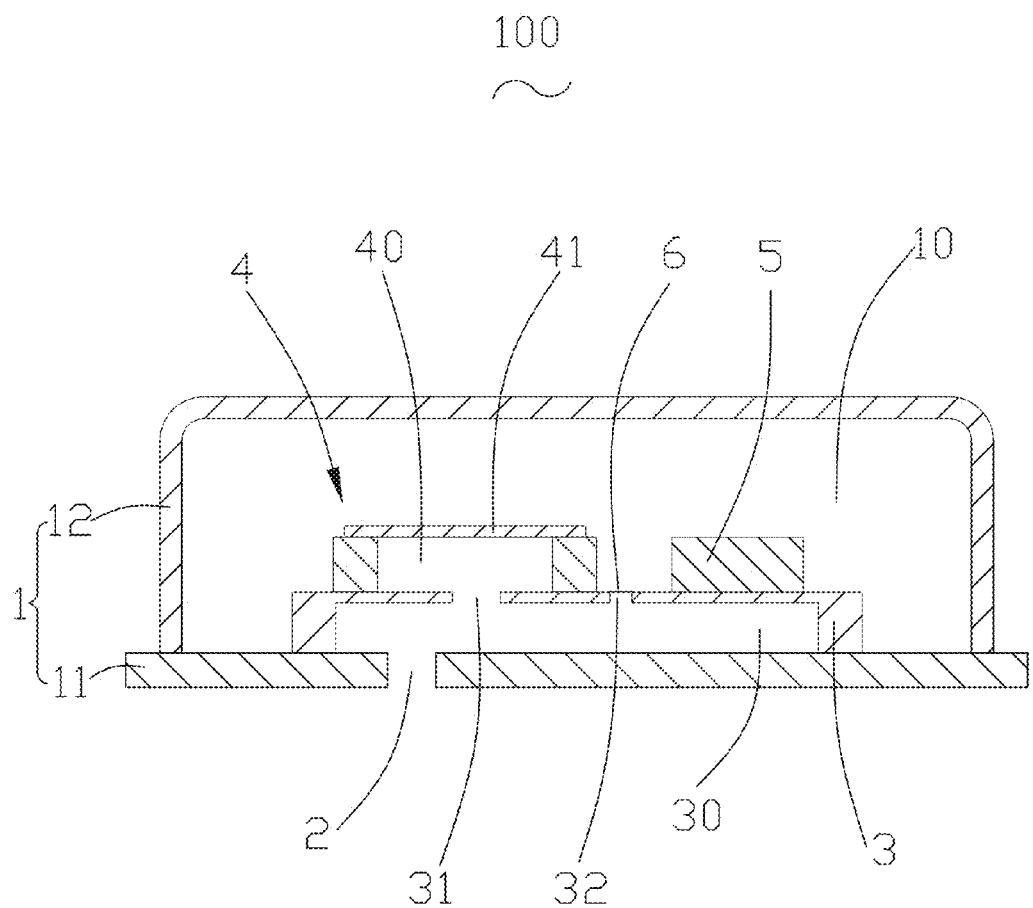
FIG. 1 is an illustrative cross-sectional view of a MEMS microphone in accordance with an exemplary embodiment of the present disclosure.
Figure 2:
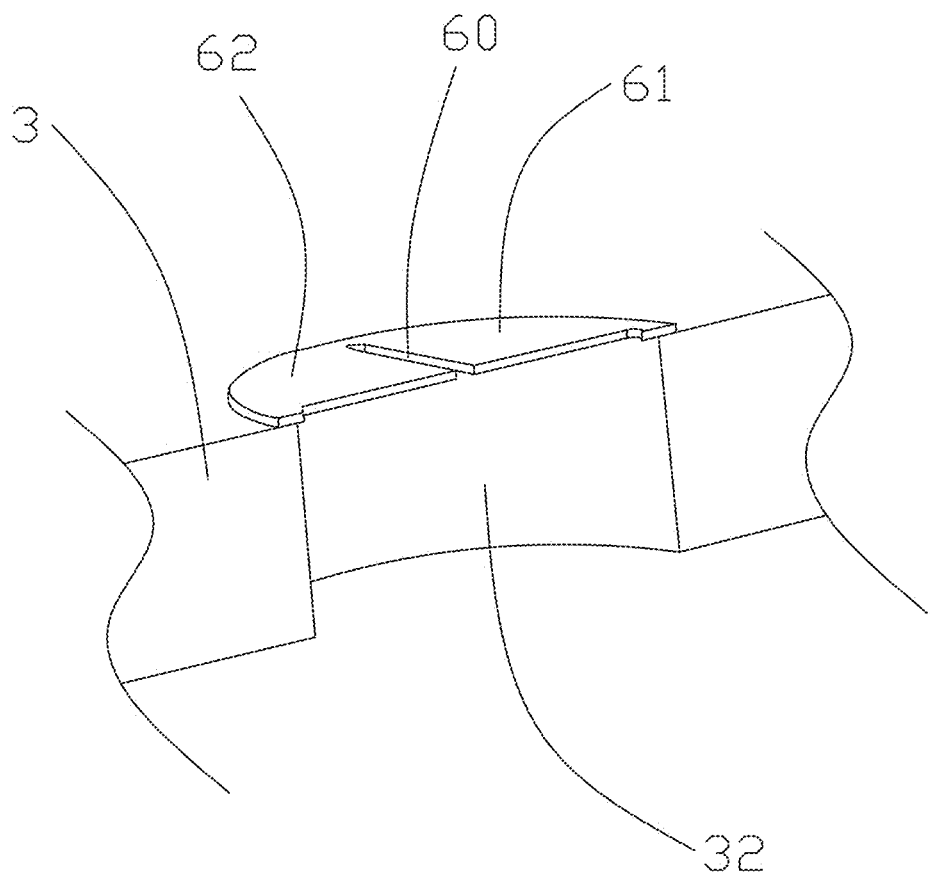
FIG. 2 is an illustration of a membrane flap and a vent hole of the MEMS microphone.

The present disclosure will hereinafter be described in detail with reference to exemplary embodiments. To make the technical problems to be solved, technical solutions and beneficial effects of the present disclosure more apparent, the present disclosure is described in further detail together with the figure and the embodiments. It should be understood the specific embodiments described hereby is only to explain the disclosure, not intended to limit the disclosure.

As shown by FIGS. 1 to 4, the present disclosure provides an MEMS microphone 100, which includes a case 1 with an accommodating cavity 10, and an acoustic vent 2 arranged on the case 1. In this embodiment, the case 1 includes a circuit board 11 and a cover 12 connected as a cover to the circuit board 11, wherein the circuit board 11 and the cover 12 form the accommodating cavity 10. The cover 12 is made of metal materials.

A housing 3 with an empty cavity 30, a MEMS chip 4 with a back cavity 40 and an ASIC chip 5 are arranged inside the accommodating cavity 10, and the MEMS chips 4 include a diaphragm 41. In this embodiment, the housing 3 is installed on the circuit board 11, of course, optionally, the housing 3 can also be installed on the cover 12. Preferably, the housing 3 is made of silicon materials.

The MEMS chip 4 is installed on the housing 3, a through hole 31 connecting to the empty cavity 30 and the back cavity 40 is arranged in the housing 3, and a vent hole 32 connecting to the empty cavity 30 and the accommodating cavity 10 is also arranged in the housing 3. The installation location of the ASIC chips 5 can be chosen randomly, preferably, the ASIC chip 5 is installed on the housing 3, by choosing this installation mode, the ASIC chip 5 will not occupy the space and position of the housing 3 and the housing 3 has enough space for a bigger empty cavity 30. The empty cavity 30 can greatly reduce the packaging stress, and reduce the impact of packaging and SMT mounting in late stage on product performance.

The MEMS microphone 100 also includes a membrane flap 6 arranged on the housing 3, in the normal state, the membrane flap 6 closes the vent hole 32, the membrane flap 6 can deform under the influence of airflow and open the vent hole 32. Preferably, the membrane flap 6 remains in a critical damping state, that is, the membrane flap 6 can open already under minor influence of airflow, thus achieving fast response. Of course, also can design the size of the vent hole 32, the venting effects can also be controlled and adjusted by changing the size and shape of the vent hole 32 and the damping of the membrane flap 6. The membrane flap 6 can be silicone film or plastic film.

Figure 3:
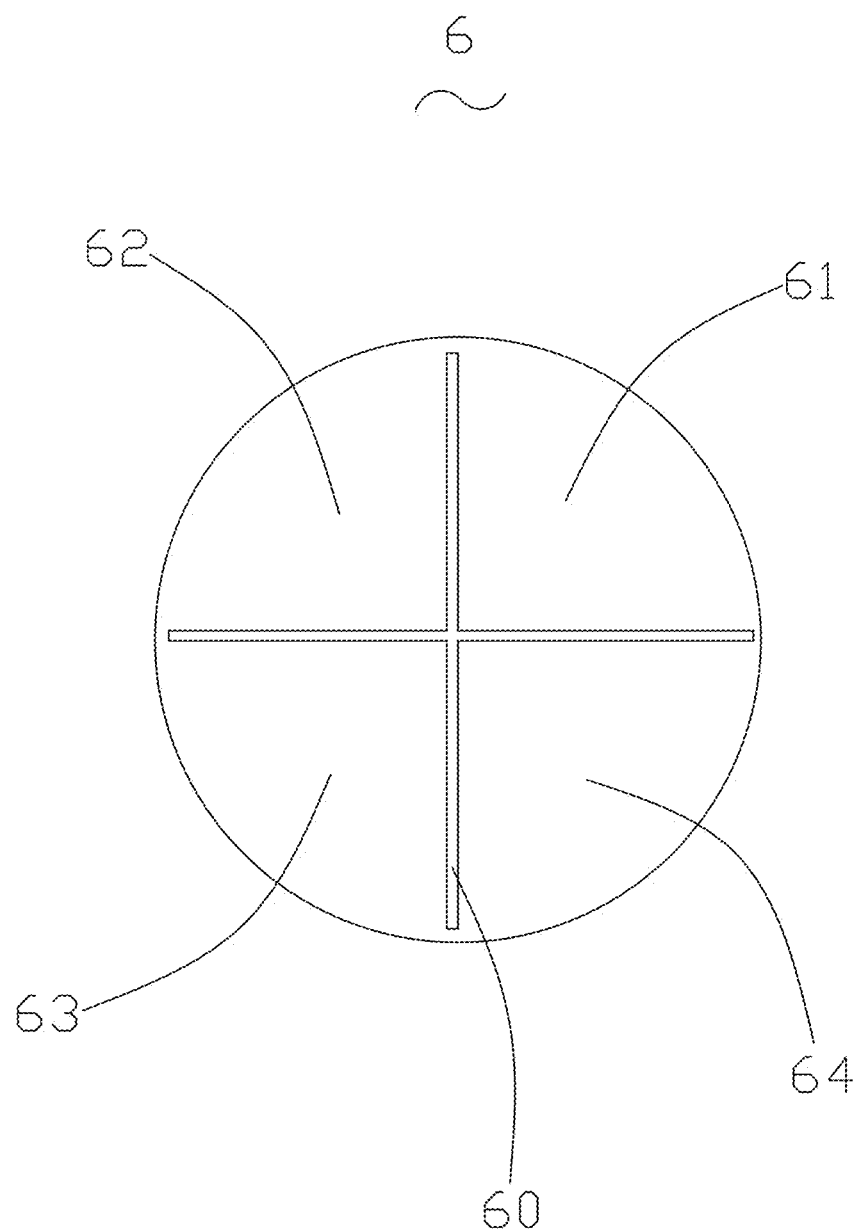
FIG. 3 is an illustration of the membrane flap of the MEMS microphone.

In this embodiment, the outer periphery of the membrane flap 6 is fixedly connected with the housing 3, a gap 60 is formed in the membrane flap 6 to divide the membrane flap 6 into several sub-membrane-flaps. Referring to FIG. 3, the gap 60 divide the membrane flap 6 into 4 sub-membrane-flaps, that is, sub-membrane-flap 61, sub-membrane-flap 62, sub-membrane-flap 63 and sub-membrane-flap 64. Of course, the form of the gap 60 is not limited to form "+", it can be in the form of "−", "Y" and other forms, and the number of the divided sub-membrane-flaps is not limited to 4, either. In addition to the way of forming sub-membrane-flaps, the way the membrane flap 6 opens the vent hole 32 can also be different, it can also be in the way that a part of the membrane flap 6 is fixed and the other part is not fixed, or in other ways that the membrane flap 6 can open the vent hole 32.

In this embodiment, the acoustic vent 2 is arranged on the circuit board 11 and is connected to the empty cavity 30, an ultrasonic microphone can be achieved with a suitable design of the empty cavity 30. Preferably, the acoustic vent 2 and the through hole 31 are arranged staggered from each other, which can effectively reduce the risk of particulate matters entering the microphone.

Figure 4:
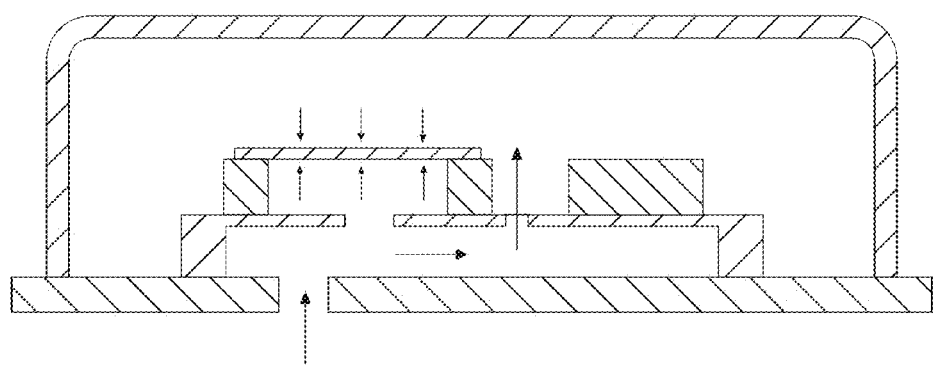
FIG. 4 is a gas flow direction diagram of the MEMS microphone shown in FIG. 1.

Referring to FIG. 4, which is the gas flow direction diagram of the MEMS microphone 100, the arrows in the Fig. are used to represent the gas flow, the membrane flap 6 deforms due to the influence of gas flow and opens the vent hole 32, which can balance the gas pressure on both sides of the diaphragm 41 of the MEMS chips 4, thus it can be avoided that the diaphragm 41 of the MEMS chips 4 get damaged due to gas flow impact. At the same time, it is not necessary to open a groove or a hole in the diaphragm 41, which ensures the strength of the diaphragm 41 itself.

Figure 5:
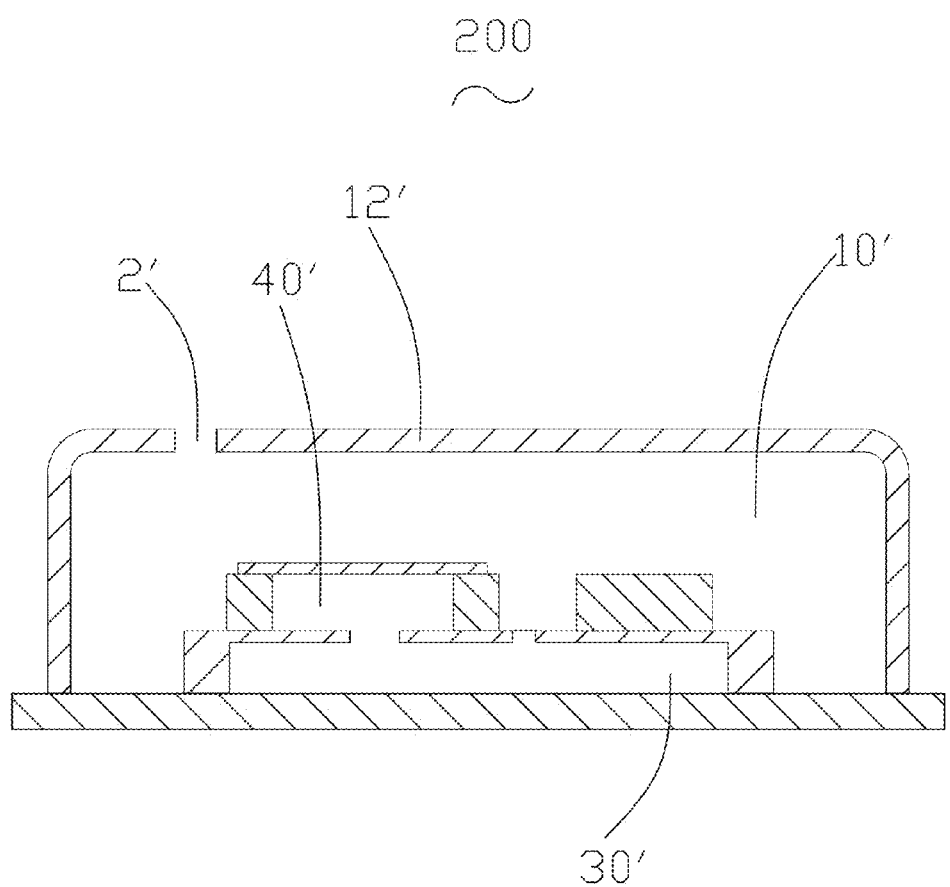
FIG. 5 is a cross-sectional view of another exemplary embodiment in accordance with the MEMS microphone provided by the present disclosure.

Referring to FIG. 5, which shows another MEMS microphone 200 provided by the present invention, the MEMS microphone 200 is different from the above mentioned MEMS microphone 100 in that: the acoustic vent 2' is arranged on the cover 12', and the acoustic vent 2' is connected to the accommodating cavity 10'. The empty cavity 30' can expand the volume of the back cavity 40', thus improving the sensitivity and signal-to-noise ratio.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A MEMS microphone comprising:
a case with an accommodating cavity;
an acoustic vent arranged on the case;
a housing with an empty cavity arranged inside the accommodating cavity and installed on the case, the housing being provided with a through hole;
a MEMS chip with a back cavity arranged inside the accommodating cavity and installed the housing;
and an ASIC chip arranged inside the accommodating cavity; wherein
the through hole communicates with the empty cavity and the back cavity, the housing is also arranged with a vent hole connecting the empty cavity and the accommodating cavity, the MEMS microphone also includes a membrane flap arranged on the housing for closing the vent hole, the membrane flap changes its shape under airflow effects and opens the vent hole.

2. The MEMS microphone as described in claim 1, wherein the acoustic vent is connected with the accommodating cavity.

3. The MEMS microphone as described in claim 1, wherein, the acoustic vent is connected with the empty cavity.

4. The MEMS microphone as described in claim 3, wherein, the acoustic vent and the through hole are arranged staggered from each other.

5. The MEMS microphone as described in claim 1, wherein the ASIC chip is installed on the housing.

6. The MEMS microphone as described in claim 1, wherein, the housing is made of silicon material.

7. The MEMS microphone as described in claim 1, wherein, the membrane flap is in critical damping state.

8. The MEMS microphone as described in claim 1, wherein, an outer periphery of the membrane flap is fixedly connected with the housing, a gap is provided in the membrane flap for dividing the membrane flap into several sub-membrane-flaps.

9. The MEMS microphone as described in claim 1, wherein, the case comprises a circuit board and a cover that is connected as a cover to the circuit board, the circuit board and the cover form the accommodating cavity, and the housing is installed in the circuit board or the cover.

\* \* \* \* \*